United States Patent [19]

Mori

[11] Patent Number: 5,289,074
[45] Date of Patent: Feb. 22, 1994

[54] PIEZO-ELECTRIC DEVICE TYPE ACTUATOR

[75] Inventor: Mitsuhiro Mori, Kawasaki, Japan

[73] Assignee: Fujitsu Limited, Kanagawa, Japan

[21] Appl. No.: 953,662

[22] Filed: Sep. 30, 1992

[30] Foreign Application Priority Data

Oct. 9, 1991 [JP] Japan .................................. 3-260926

[51] Int. Cl.⁵ ........................................... H01L 41/08
[52] U.S. Cl. .................................................. 310/328
[58] Field of Search ............... 310/323, 328, 366, 338; 400/124; 101/93.05

[56] References Cited

U.S. PATENT DOCUMENTS

| | | | |
|---|---|---|---|
| 5,005,994 | 4/1991 | Yano | 400/124 |
| 5,078,520 | 1/1992 | Yano et al. | 310/128 X |
| 5,092,689 | 3/1992 | Yano | 400/124 |

FOREIGN PATENT DOCUMENTS 2-36951 2/1990 Japan .
3-240280 10/1991 Japan .

*Primary Examiner*—Mark O. Budd
*Attorney, Agent, or Firm*—Nikaido Marmelstein Murray & Oram

[57] ABSTRACT

A piezo-electric device type actuator of the invention is less susceptible to damage in the to joint portions of between a laminated piezo-electric device and a base member or a movable block. The piezo-electric device type actuator includes a laminated piezo-electric device having a plural number of piezo-electric ceramics laminated to a predetermined length; a stationary base member; a pair of resilient plates extended along opposite lateral side surfaces of the laminated piezo-electric device, respectively, with each plate welded at one end to the base member; and a movable block welded to the other end of each of the resilient plates while applying a predetermined compressive force to the laminated piezo-electric device. The laminated piezo-electric device is fixed to the base member and movable block by welding to provide bondage of high reliability between these parts.

3 Claims, 3 Drawing Sheets

FIG.I PRIOR ART
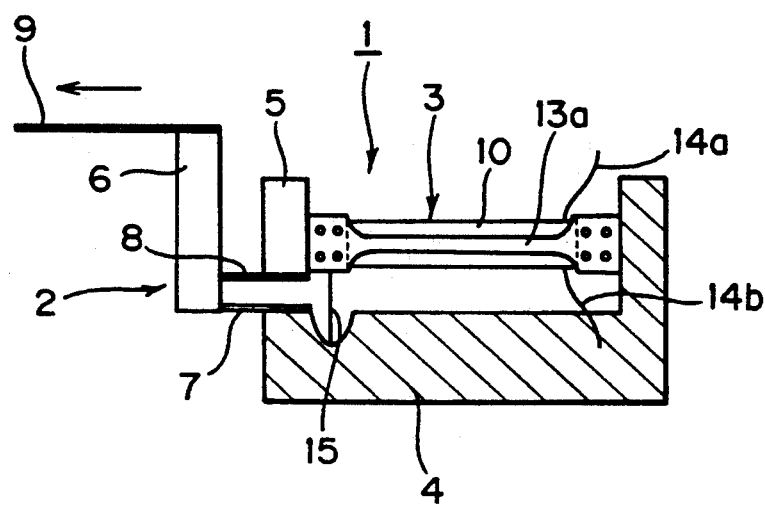
FIG.2 PRIOR ART
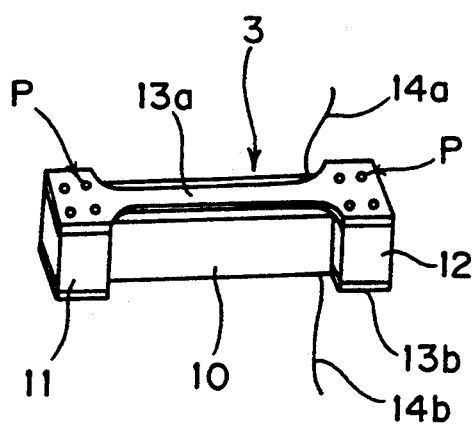

PIEZO-ELECTRIC DEVICE TYPE ACTUATOR

BACKGROUND OF THE INVENTION

1. Field of the Art

This invention relates to a piezo-electric device type actuator suitable for use on a wire dot printer or the like.

2. Description of the Prior Art

Recently, in step with the acceleration of the printing speed in wire dot printers, laminated piezo-electric devices are increasingly resorted to for driving printing wires on a printing head. The laminated piezo-electric devices usually contain a plural number of internal electrodes and a couple of external electrodes, which are connected to the internal electrodes, and are required to have high reliability since they are driven under high voltage and severe operating conditions.

Referring to FIG. 1, there is illustrated a conventional printing element using a laminated piezo-electric device. The printing element 1 is constituted by a displacement magnifying mechanism 2, an actuator 3, a base member 4 linking the displacement magnifying mechanism 2 and the actuator 3, and a movable block 5. The displacement magnifying mechanism 2 is constituted by an armature 6, and a pair of leaf springs 7 and 8 which are disposed in parallel relation with each other to support one end of the armature 6. The leaf spring 7 is fixedly secured to the base member 4, while the other leaf spring 8 is fixedly secured to the movable block 5. A printing wire 9 is securely fixed to the other end of the armature 6.

As best shown in the perspective view of FIG. 2, the actuator 3 is constituted by a laminated piezo-electric device 10, blocks 11 and 12 which are located at the opposite ends of the laminated piezo-electric device 10 in such a manner as to sandwich the latter, and resilient plates 13a and 13b which are extended along the opposite sides of the laminated piezo-electric device 10 and welded to the latter by laser welding at the positions of points P while applying a predetermined compressive force to the laminated piezo-electric device 10.

The blocks 11 and 12 are fixedly bonded to the movable block 5 and base member 4, respectively, by the use of an adhesive. The block 11 is linked to the base member 4 through a leaf spring 15 for the purpose of stabilizing the operation of the laminated piezo-electric device 10.

The laminated piezo-electric device 10 is constituted by a plural number of laminated piezo-electric ceramics layers, a plural number of internal electrodes which are sandwiched between the respective piezo-electric ceramics layers, a couple of external electrodes which are alternately connected to every other internal electrode, and lead wires 14a and 14b which are connected to the external electrodes 13a and 13b, respectively.

Upon applying a drive voltage to the lead wires 14a and 14b, the laminated type piezo-electric device 10 is deformed to stretch by ten and several micrometers. As a result, the movable block 5 is pushed in the leftward direction in FIG. 1, and the armature 6 is turned about its lower end portion by bi-metal action of the leaf springs 7 and 8 to magnify the displacement of the movable block 5, thereby driving the printing wire 9 to protrude forward by several hundred micrometers. As a result, the wire 9 is hit against the platen, through an ink ribbon and a printing paper sheet which are not shown, to print a dot on the paper.

However, when the actuator of the above-described construction in which the blocks 11 and 12 at the opposite ends of the laminated type piezo-electric device 10 ar bonded to the movable block 5 and base member 4 by means of an adhesive, there has been a problem that, due to insufficient strength in the bondage of the adhesive, the blocks are apt to be loosened or detached in the course of printing operations, thereby failing to operate in a stable state in terms of performance quality. Damage is especially likely to occur on the part of the movable block which is subjected to bending stress in addition to tensile stress.

SUMMARY OF THE INVENTION

In accordance with an aspect of the present invention, there is provided a piezo-electric device type actuator constituted by: a laminated piezo-electric device including a plural number of laminated piezo-electric ceramics layers, a plural number of internal electrodes sandwiched between the respective piezo-electric ceramics layers, a first external electrode connected to alternate ones of the internal electrodes, and a second external electrode connected to the other alternate ones of the internal electrodes, the laminated piezo-electric device having first and second side surfaces on the opposite lateral sides thereof; a stationary base member; a pair of resilient plates extended along the first and second side surfaces of the laminated piezo-electric device, respectively, and each welded at one end to the base member; and a movable block welded to the other end of each of the resilient plates while applying a predetermined compressive force to the laminated piezo-electric device.

In the piezo-electric device type actuator according to the present invention, the paired resilient members are fixedly welded to the movable block and base member to secure higher strength than to conventional fixation using an adhesive. As a result, it becomes possible to prevent damage caused by shock or vibration when the movable block is displaced by application of a drive voltage to the laminated piezo-electric device. Accordingly, when used for a printing element, the piezo-electric device type actuator can ensure stabilized performance quality in printing operations.

The above and other objects, features and advantages of the present invention and the manner of realizing them will become more apparent, and the invention itself will be best understood from a study of the following description and appended claims with reference to the attached drawings which show by way of example some preferred embodiments of the invention.

BRIEF DESCRIPTION OF THE DRAWINGS

In the accompanying drawings:

FIG. 1 is a partly sectioned side view of a conventional printing element;

FIG. 2 is a perspective view of a conventional piezo-electric device type actuator;

DESCRIPTION OF PREFERRED EMBODIMENT

Hereafter, the invention is described more particularly by way of preferred embodiments with reference to the drawings.

Figure 3:
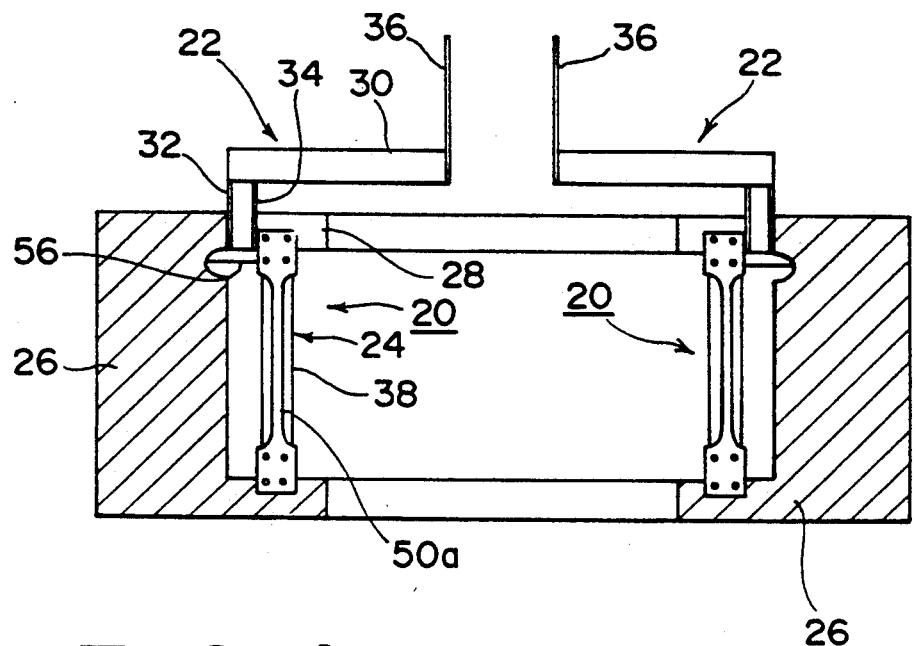
FIG. 3 is a schematic sectional view of a printing head employing a piezo-electric device type actuator embodying the present invention.

Referring to FIG. 3, there is illustrated, in a schematic sectional view, a printing head incorporating a piezo-electric device type actuator according the present invention. The printing head is constituted by a plural number of printing elements 20 which are mounted along the inner peripheral surface of a base member 26 of substantially cylindrical shape. Each printing element 20 includes a displacement magnifying mechanism 22, a piezo-electric device type actuator 24, a base member 26 to which one end of the piezo-electric device type actuator 24 is fixedly connected, and a movable block 28 to which the other end of the actuator 24 is fixedly connected.

The displacement magnifying mechanism 22 includes an armature 30, and a pair of parallel leaf springs 32 and 34 which are securely fixed to one end of the armature 30. The leaf spring 32 is fixed to the base member 26, while the other leaf spring 34 is fixed to the movable block 28. The armature 30 has a printing wire 36 securely fixed to the other end thereof.

Figure 4:
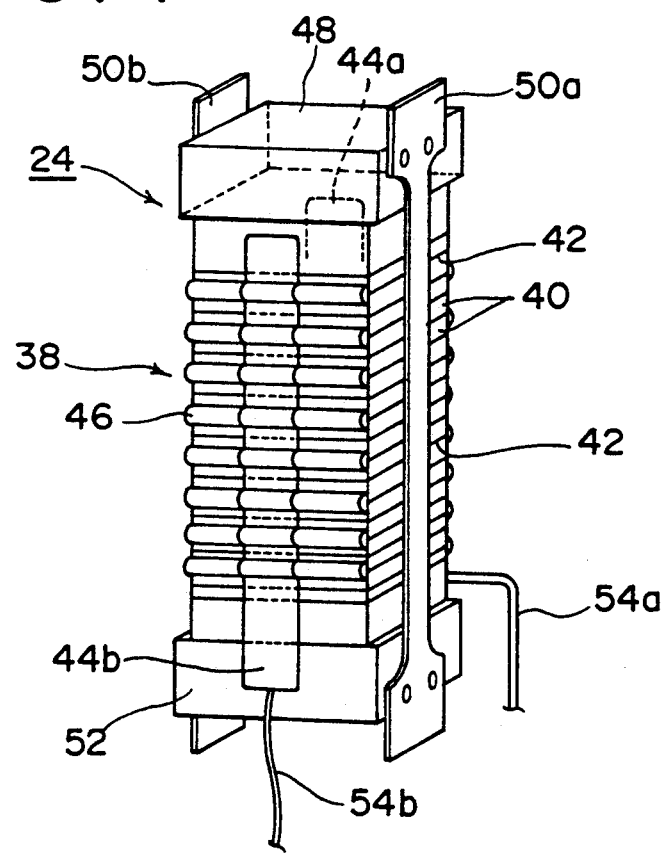
FIG. 4 is a perspective view showing the details in construction of the piezo-electric device type actuator according to the invention.

As best shown in FIG. 4, the piezo-electric device type actuator 24 includes a laminated piezo-electric device 38 which is constituted by a large number of laminated piezo-electric ceramics layers 40 and internal electrodes 42 sandwiched between the respective piezo-electric ceramics layers 40, a first external electrode 44a disposed on one lateral side surface of the piezo-electric device 38 and connected to alternate ones of the internal electrodes 42, and a second external electrode 44b disposed on the opposite lateral side surface of the piezo-electric device 38 and connected to the other alternate ones of the internal electrodes 42. The reference numeral 46 denotes semi-cylindrical insulation layers which are formed between the first external electrode 44a or the second external electrode 44b and the internal electrodes 42 to be insulated therefrom, thereby permitting alternate connections of the first and second external electrodes 44a and 44b with the internal electrodes 42. The first external electrode 44a on the positive side is connected through lead wire 54a to an anode terminal of a drive circuit, not shown, while the second external electrode 44b on the negative side is connected through lead wire 54b to the grounded base member 26.

The laminated piezo-electric device 38 is produced by laminating a plural number of green sheets of piezo-electric ceramics, each having a metal paste film formed on one side for formation of the internal electrode, and sintering the laminated sheets at a predetermined temperature for a predetermined time length. A pair of resilient plates 50a and 50b are extended along the other lateral side surfaces of the laminated piezo-electric device 38, which are disposed perpendicularly between the lateral side surfaces with the first and second external electrodes 44a and 44b. Each one of the resilient plates 50a and 50b has one end thereof securely fixed by laser welding to a block 48 provided at one end of the laminated piezo-electric device 38, and the other end securely fixed by laser welding to a block 52 provided at the other end of the laminated piezo-electric device 38 while exerting a predetermined compression pressure to the latter. As shown in FIG. 4, the opposite ends of the resilient plates 50a and 50b protrude from on the outer sides of the blocks 48 and 52 over a predetermined length.

Figure 5:
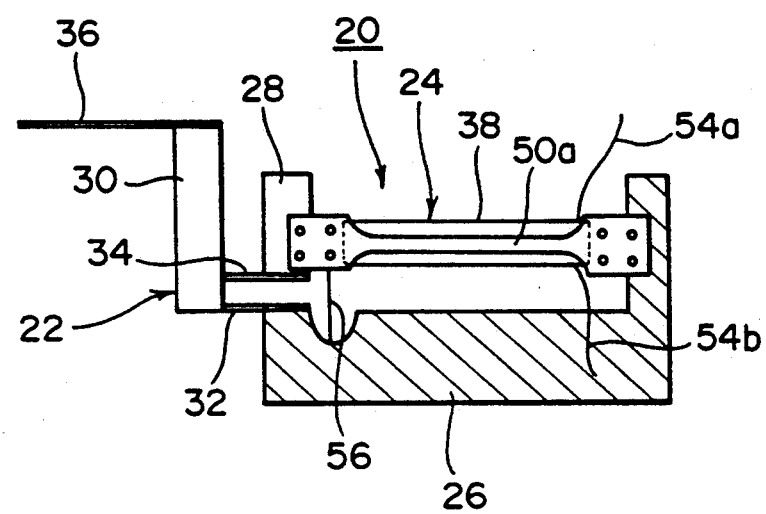
FIG. 5 is a partly sectioned side view of a printing element employing the piezo-electric device type actuator according to an embodiment of the present invention.
Figure 6:
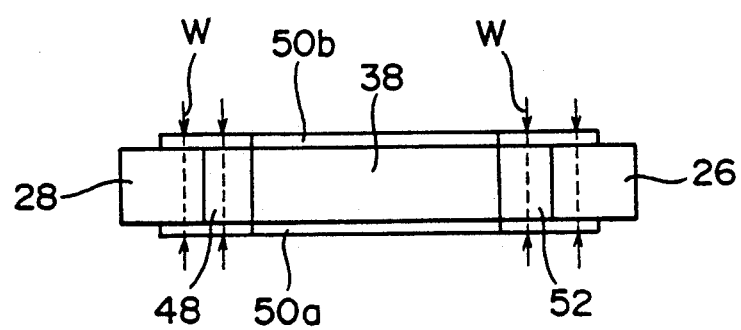
FIG. 6 is a plan view of the piezo-electric device type actuator according to the embodiment of the invention.

Referring to FIGS. 5 and 6, the ends of the resilient plates 50a and 50b on the side of the block 48 are secured to the movable block 28 by laser welding while abutting the block 48 against the movable block 28. The other ends of the resilient plates 50a and 50b are secured to the base member 26 while abutting the block 52 against the base member 26. Namely, at the points indicated by the letter "W", the resilient plates 50a and 50b are welded to the base member 26, movable block 28 and blocks 48 and 52 by laser welding. The block 48 is connected to the base member 26 through a leaf spring 56 to stabilize the operation of the laminated piezo-electric device.

According to the above-described embodiment, the resilient plates 50a and 50b are securely fixed to the blocks 48 and 52 by laser welding, and at the same time the protruded outer ends of the resilient plates 50a and 50b are securely fixed to the lateral sides of the base member 26 and movable block 28, thereby ensuring connections of high strength of the laminated piezo-electric device 38 with the base member 26 and movable block 28.

Accordingly, as a drive voltage is applied to the lead wires 54a and 54b of the piezo-electric device type actuator 24, the movable block 28 is pushed out in the leftward direction in FIG. 5 due to distortion of the laminated piezo-electric device 38 in the stretching direction. This displacement of the movable block 28 is magnified through the displacement magnifying mechanism 22 for a printing operation by the printing wire 36. At this time, even if a shock or vibration is applied to the joint portion between the laminated piezo-electric device 38 and the base member 26 or the movable block 28, there is less possibility of a fracture or other damages occurring at the joint portions because the laminated piezo-electric device 38 is connected to the base member 26 and movable block 28 with higher strength as compared with the conventional bandage by an adhesive. Consequently, it becomes possible to obtain stabilized performance quality in printing operations.

Upon completion of a printing operation, the laminated piezo-electric device 38 is de-energized, and the printing wire 36 which has finished one printing action is returned to its initial position as a result of recovery of the laminated piezo-electric device 38.

Although the piezo-electric device type actuator 24 has the blocks 48 and 52 securely fixed to the opposite ends of the laminated piezo-electric device 38 in the above-described embodiment, it is to be understood that the present invention is not restricted to such an arrangement. For example, if desired, there may be employed an arrangement in which the blocks 48 and 52 are omitted and the laminated piezo-electric device 38 is held in compressed state between the base member 26 and movable block 28, to which the opposite ends of the resilient plates 50a and 50b are securely fixed by laser welding.

Further, although the piezo-electric device type actuator of the invention has been shown as an actuator for a printing element in the foregoing embodiment, it can be adopted in various other applications as an actuator serving for other purposes.

What is claimed is:

1. A piezoelectric device type actuator, comprising:
a laminated piezoelectric device including a plural number of laminated piezoelectric ceramics layers, a plural number of internal electrodes sandwiched between the respective piezoelectric ceramics layers, a first external electrode connected to alternate ones of said external electrodes, and a second external electrode connected to the other alternate ones of said internal electrodes, said laminated piezoelectric device having first and second side surfaces on the opposite lateral sides thereof;
a stationary base member;
a pair of resilient plates extended along the first and second side surfaces of said laminated piezoelectric device, respectively, and each welded at one side of said base member;
a movable block welded to the other end of each of said resilient plates while applying a predetermined compressive force to said laminated piezoelectric device;
a first block interposed between said base member and one end of said laminated piezoelectric device, and securely welded to one end of each of said pair of resilient plates; and
a second block interposed between said movable block and the other end of said laminated piezoelectric device, and securely welded to the other end of each of said pair of resilient plates.

2. A piezo-electric device type actuator as defined in claim 1, wherein said first and second external electrodes are mounted on third and fourth lateral side surfaces of said laminated piezo-electric device disposed perpendicularly to said first and second lateral side surfaces, said first external electrode being connected to a drive circuit and said second external electrode being connected to the ground.

3. A piezoelectric device type actuator, comprising:
a pre-compressed laminated piezoelectric device including a plural number of laminated piezoelectric ceramics layers, a plural number of internal electrodes sandwiched between the respective piezoelectric ceramics layers, a first external electrode connected to alternate ones of said external electrodes, and a second external electrode connected to the other alternate ones of said internal electrodes, said pre-compressed piezoelectric device having first and second side surfaces on the opposite lateral sides thereof, and further said pre-compressed piezoelectric device being pre-compressed with a predetermined compressive force;
a stationary base member;
a pair of resilient plates extended along the first and second side surfaces of said pre-compressed piezoelectric device, respectively, and each welded at one end to said base member;
a movable block welded to the other end of each of said resilient plates;
a first block interposed between said base member and one end of said laminated piezoelectric device, and securely welded to one end of each of said pair of resilient plates; and
a second block interposed between said movable block and the other end of said laminated piezoelectric device, and securely welded to the other end of each of said pair of resilient plates.

* * * * *